Sept. 8, 1964 H. BASSECHES ETAL 3,148,129

METAL FILM RESISTORS

Filed Oct. 12, 1959

INVENTORS H. BASSECHES
P. L. Mc GEOUGH
D. A. Mc LEAN

BY George S. Indig

ATTORNEY

United States Patent Office 3,148,129

Patented Sept. 8, 1964

3,148,129
METAL FILM RESISTORS

Harold Basseches, Allentown, Pa., and Patrick L. McGeough, Summit, and David A. McLean, Chatham, N.J., assignors to Bell Telephone Laboratories, Incorporated, New York, N.Y., a corporation of New York Filed Oct. 12, 1959, Ser. No. 845,754
1 Claim. (Cl. 204—38)

This invention relates to a method for producing precision metal film resistors, and to the resistors so produced.

A widely used method for reducing the size of electrical apparatus is the substitution of printed circuits for conventional wiring. The advent of semiconductive devices has made possible miniaturization of entire circuits. These developments have evolved a need for precise, accurate methods of producing printed circuit components such as resistors and capacitors. A copending application, Serial No. 801,535, filed March 24, 1959, describes a method which is suitable for the production of printed circuit capacitors within very narrow tolerances. The present invention is directed to a process for the production of precision metal film resistors which are suitable for use in printed circuit applications.

Heretofore, conventional printed circuit resistors consisted of an array of parallel lines which were connected at alternate ends to form a continuous path. The configuration also included "shorting bars" which served to connect alternate lines, thereby shorting out the resistance of the line intermediate the two connected lines. The resistor was designed to have a resistance which was lower than the desired value, and adjustment was made by cutting through an appropriate number of shorting bars. By reason of the nature of this prior art adjustment method, tolerances of resistors so produced were of the order of ±5 percent.

In accordance with the inventive method, metal film resistors are produced within tolerances of ±1 percent. An incidental advantage of the present method is the formation of a protective film over the surface of the resistor which precludes subsequent variation in resistance which might otherwise occur due to contamination of the resistor surface.

The first step in the production of the inventive resistor is the deposition of a thin layer of a film-forming metal. Metals such as tantalum, titanium, zirconium, hafnium, aluminum and niobium are suitable for this purpose. The configuration and thickness of the deposited layer are chosen so that the resistance of the deposited layer is less than that ultimately desired. The deposited layer is then electrolytically anodized in the customary manner to convert a portion of the metal layer thickness to the oxide form, a dielectric, thereby increasing the resistance of the layer. Anodization is continued until the resistance of the metal layer attains the desired value as indicated by a continuous monitoring means. The oxide formed over the surface of the layer during the anodizing step acts as a protective coating.

Figure 1:
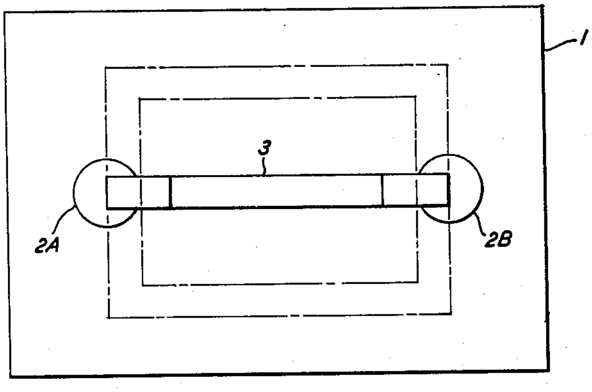
Figure 2:
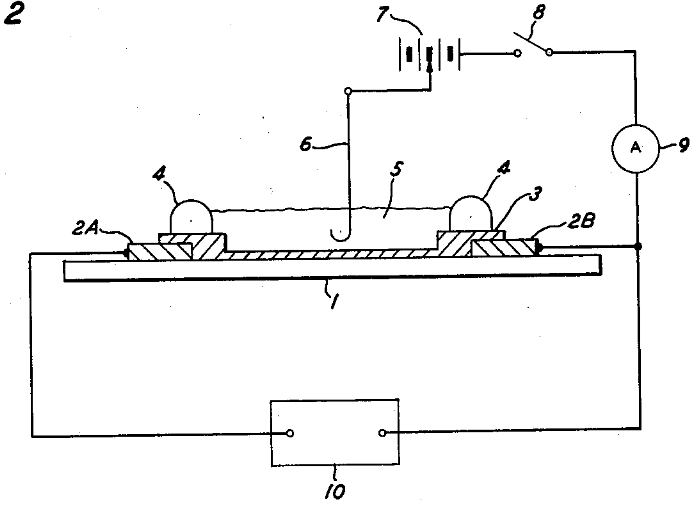

The invention may be more readily understood by reference to the figures in which:

FIG. 1 is a plan view of a substrate with a layer of film-forming metal deposited thereon in accordance with the inventive method; and FIG. 2 is a schematic view of a device undergoing processing showing anodization of a layer of film-forming metal in accordance with the inventive method.

With reference now to the drawings, FIG. 1 depicts a substrate 1, composed of one of the refractory insulating materials usually employed in the construction of printed circuit boards, which has deposited thereon two terminals, 2A and 2B, of an electrically conductive metal, such as gold, silver or copper, and a layer 3 of a film-forming metal such as tantalum. Conductive terminals 2A and 2B are not essential to the practice of this invention. However, such terminals have been included in the description because they are customarily employed in the construction of printed circuit boards. The configuration and thickness of tantalum layer 3 are chosen so that the resistance of the layer measured between terminals 2A and 2B is less than the desired value. In accordance with the inventive method, the resistance of layer 3 is increased by electrolytic anodization.

Anodization of layer 3 requires that it be in contact with a suitable electrolyte. To this end, strips of electroplater's tape are placed on substrate 1 to cover the area within the dashed lines shown in FIG. 1. A dam of a suitable plastic material such as beeswax is then constructed on the tape to confine the electrolyte and prevent it from contacting terminals 2A and 2B. A schematic diagram of the anodization step is depicted in FIG. 2.

Shown in FIG. 2 is substrate 1, terminals 2A and 2B, and tantalum layer 3. Walls 4 of the dam are also depicted, the electroplater's tape being omitted from the figure to simplify the exposition. Electrolyte 5 which is contained by dam walls 4 may be any one of the conventional anodizing electrolytes, such as, for example, a solution consisting of water, ethylene glycol, and oxalic acid. Cathode 6, which is immersed in electrolyte 5, is conveniently composed of tantalum or platinum. The electrical circuit connecting cathode 6 and terminal 2B includes a variable direct-current power supply 7, switch 8, and ammeter 9, all disposed as shown in FIG. 2. A resistance monitoring means 10 such as a Leeds and Northrup Type S Test Set is connected to terminals 2A and 2B and provides a continuous indication of the resistance of tantalum layer 3.

Anodization of layer 3 is initiated by closing switch 8 and applying a low direct-current voltage between cathode 6 and layer 3. The surface of layer 3 in contact with electrolyte 5 is converted to the oxide form, the extent of such conversion being directly dependent upon the voltage applied. The anodizing voltage is gradually increased, maintaining the current density at a low value, until resistance monitoring means 10 indicates that the desired value of resistance has been attained. Switch 8 is then opened, terminating the anodization process.

The accuracy with which resistors may be produced in accordance with the present invention is due in large measure to the linear relationship between the anodizing voltage and the thickness of the anodized film. In general, approximately 7 to 10 angstroms of metal thickness are converted per unit of anodizing voltage, the continuous monitoring feature of the inventive method eliminating the effect of such variables as temperature and concentration of electrolyte.

The film-forming metal film may be initially deposited by sputtering or vacuum evaporation techniques. As indicated above, the configuration and thickness of the film are determined by the ultimate value of resistance desired. The initial thickness of the deposited metal film is preferably above 350 angstroms. This value is based on two factors; first, the metal thickness subsequent to anodization is preferably greater than 100 angstroms to assure continuity, and, second, conversion of at least 250 angstroms to oxide is preferably from the standpoint of ease of operation.

There is no upper limit of initial film thickness dictated by considerations of the inventive process. Any film thickness which conforms to the desired ultimate resistance value is suitable. However, considerations of the difference in temperature coefficient of expansion between the substrate and the film dictate a maximum of approximately 25,000 angstroms.

The anodizing procedure employed in the present method is governed by all of the factors generally encountered in conventional anodization procedures. Any one of the customary electrolytes such as a dilute aqueous solution of nitric acid, boric acid, acetic acid, or citric acid may be employed. Anodization is initiated at a relatively low voltage in accordance with conventional procedures. The voltage is increased maintaining the current density preferably within the range of .2 to 5 milliamperes per square centimeter. The upper limit of this preferred range is based on the fact that higher values result in substantial heating effects which are undesirable. At current densities below .2 milliampere per square centimeter, the anodizing process proceeds at a rate which is too slow from a practical standpoint. The upper limit of anodizing voltage is approximately 400 volts since higher voltages may introduce unwanted side-effects such as scintillation and corrosion. Based on this maximum figure and the rate of conversion of 7 to 10 angstroms per volt, approximately 3,000 to 4,000 angstroms of metal film thickness may be converted to oxide in accordance with this invention.

The invention method facilitates the production of printed circuit boards in that all of the resistive components may be deposited simultaneously, and then individually sized. Another advantage of the present method is that it obviates the necessity for critical control of the sputtering or deposition step. Since the initial resistance of the layer is not an important factor. The excellent flexibility of the inventive method is reflected by the fact that the elements varying in resistance from one ohm to several megohms may be produced from a layer of approximately 3,000 angstroms in thickness, the configuration of the layer being chosen to fit the ultimate resistive value desired.

Data obtained by the practice of the present invention are set forth in Table 1. Column 1 indicates the initial resistance of the deposited metal film, column 2 shows the ultimate resistive value desired, column 3 lists the resistive values obtained by the anodization step, column 4 lists the maximum anodizing voltage required, and column 5 is the percent deviation of the actual resistive value from the desired resistive value.

*Table 1*

| Example | Initial Resistive Value (Ohms) | Desired Ultimate Resistive Value (Ohms) | Actual Resistive Value (Ohms) | Maximum Anodizing Voltage (Volts) | Deviation (Percent) |
|---|---|---|---|---|---|
| 1 | 119.51 | 2,000 | 2,014.2 | 140 | +0.71 |
| 2 | 98.13 | 1,000 | 1,003.9 | 146 | +0.39 |
| 3 | 100.38 | 1,000 | 1,004.5 | 144 | +0.45 |
| 4 | 106.73 | 1,000 | 1,001.6 | 135 | +0.16 |
| 5 | 100.52 | 1,000 | 1,001.9 | 145 | +0.19 |
| 6 | 110.12 | 1,000 | 1,004.4 | 135 | +0.44 |

The procedure employed in each of Examples 1 through 6 was as follows:

A film of tantalum of the order of 1500 angstroms in thickness was deposited on a glass microscope slide in accordance with conventional sputtering techniques. The tantalum film was disposed on the slide so that the ends thereof were in contact with gold terminals which had been previously formed on the glass slide. Electroplater's tape was placed on the glass slide to form a rectangle in such manner that substantially all of the tantalum layer was exposed within the rectangle. A rectangular dam of beeswax approximately 0.2 centimeter high was constructed on the electroplater's tape.

An electrolyte consisting of an aqueous oxalic acid solution, 5 percent by weight, was introduced into the dammed area. A tantalum wire cathode, variable direct-current power supply, ammeter, and a Leeds and Northrup Type S Test Set were connected substantially as shown in FIG. 2. The anodizing voltage was increased while maintaining the current density in the range of from .4 to 1.2 milliamperes per square centimeter. Anodization was continued until the Leeds and Northrup Test Set indicated that the ultimate resistive value had been obtained.

Although a specific electrolyte and specific film-forming metal were employed in the illustrative examples described above, it is to be understood that the present invention may be practiced with any film-forming metal and utilizing any anodizing medium. It is to be appreciated that the scheme depicted in FIG. 2 for restricting the area of contact of electrolyte is merely illustrative and any equivalent method, such as the use of a photo-resist mask, is suitable. Variations in the described process may be made by one skilled in the art without departing from the spirit and scope of this invention.

What is claimed is:

The method of producing a resistor comprising the steps of coating an insulation substrate with a film of a metal capable of anodically forming a dielectric coating, providing two direct electrical contacts to said film, positioning said contacts so they will serve for measurement of resistance of said film and will not directly touch an anodizing electrolyte placed against the exposed face of said film, passing an anodizing current between said film and an electrode immersed in said electrolyte, measuring the electrical resistance between said contacts during said anodizing step, and terminating said anodizing when the measured resistance reaches a desired value.

References Cited in the file of this patent

UNITED STATES PATENTS 2,706,697 Eisler ---- Apr. 19, 1955
2,743,400 Bujan ---- Apr. 24, 1956
2,784,154 Korbelak et al. ---- Mar. 5, 1957
2,874,102 Wainer ---- Feb. 17, 1959
2,885,524 Eisler ---- May 5, 1959

FOREIGN PATENTS 444,892 Great Britain ---- Mar. 26, 1936